(12) United States Patent
Auman et al.

(10) Patent No.: US 9,050,784 B2
(45) Date of Patent: Jun. 9, 2015

(54) FIRE RESISTANT BACK-SHEET FOR PHOTOVOLTAIC MODULE

(75) Inventors: Brian C. Auman, Avondale, PA (US); Carl Robert Haeger, Reynoldsburg, OH (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 145 days.

(21) Appl. No.: 13/315,324

(22) Filed: Dec. 9, 2011

(65) Prior Publication Data

US 2012/0325306 A1    Dec. 27, 2012

Related U.S. Application Data

(60) Provisional application No. 61/425,826, filed on Dec. 22, 2010.

(51) Int. Cl.
| | |
|---|---|
| *H01L 31/048* | (2014.01) |
| *B32B 27/34* | (2006.01) |
| *B32B 27/08* | (2006.01) |
| *B32B 27/20* | (2006.01) |
| *B32B 27/28* | (2006.01) |
| *B32B 27/30* | (2006.01) |
| *H01L 31/049* | (2014.01) |

(52) U.S. Cl.
CPC ............ *B32B 27/34* (2013.01); *Y10T 428/269* (2015.01); *Y10T 428/259* (2015.01); *Y10T 428/251* (2015.01); *Y10T 428/256* (2015.01); *B32B 27/08* (2013.01); *B32B 27/20* (2013.01); *B32B 27/281* (2013.01); *B32B 27/304* (2013.01); *B32B 2457/12* (2013.01); *Y02E 10/50* (2013.01); *H01L 31/049* (2014.12)

(58) Field of Classification Search
CPC ........ H01L 31/00–31/078; Y02E 10/50–10/60
USPC ................................................. 136/243–265
See application file for complete search history.

(56) References Cited

U.S. PATENT DOCUMENTS

| | | |
|---|---|---|
| 2,215,061 A | 9/1940 | Alt |
| 2,419,010 A | 4/1947 | Coffman et al. |
| 2,686,737 A | 8/1954 | Caroselli et al. |

(Continued)

FOREIGN PATENT DOCUMENTS

| | | |
|---|---|---|
| DE | 90623 | 6/1972 |
| EP | 1781735 B1 | 12/2008 |

(Continued)

OTHER PUBLICATIONS

U.S. Appl. No. 13/608,105, filed Sep. 10, 2012.

(Continued)

*Primary Examiner* — Bach Dinh (57) ABSTRACT

A back-sheet for a photovoltaic module is provided comprising a fire resistant polymeric film and a second polymeric film adhered to the fire resistant polymeric film. The fire resistant polymeric film comprises a polymer that does not melt at temperatures below 275° C. and an inorganic particulate filler selected from inorganic metal oxides and inorganic metal nitrides, and combinations thereof. The fire resistant polymeric film contains from 40 to 75 weight percent inorganic particulate filler based on the total weight of the film, and the fire resistant polymeric film has an average thickness of at least 85 microns. A photovoltaic module comprising such a back-sheet is also provided.

13 Claims, 1 Drawing Sheet

(56) References Cited

U.S. PATENT DOCUMENTS

| | | | |
|---|---|---|---|
| 2,953,818 A | 9/1960 | Bartron | |
| 3,063,966 A | 11/1962 | Kwolek et al. | |
| 3,179,614 A | 4/1965 | Edwards | |
| 3,179,633 A | 4/1965 | Endrey | |
| 3,179,634 A | 4/1965 | Edwards | |
| 3,492,125 A * | 1/1970 | Gardner | 426/523 |
| 3,591,559 A | 7/1971 | Kwolek | |
| 4,526,830 A | 7/1985 | Ferziger et al. | |
| 4,657,627 A | 4/1987 | Bernewitz et al. | |
| 4,746,565 A | 5/1988 | Bafford et al. | |
| 4,999,168 A | 3/1991 | Ten Eyck | |
| 5,166,308 A | 11/1992 | Kreuz et al. | |
| 5,912,062 A | 6/1999 | Kotliar et al. | |
| 6,228,281 B1 | 5/2001 | Sage | |
| 6,312,561 B1 | 11/2001 | Forsten et al. | |
| 6,521,825 B2 | 2/2003 | Miura et al. | |
| 6,632,518 B1 | 10/2003 | Schmidt et al. | |
| 6,818,819 B2 | 11/2004 | Morizane et al. | |
| 6,835,676 B2 | 12/2004 | Kim et al. | |
| 6,960,543 B2 | 11/2005 | Kim et al. | |
| 6,991,845 B2 | 1/2006 | Levit et al. | |
| 7,211,529 B2 | 5/2007 | Kim et al. | |
| 7,469,427 B2 | 12/2008 | Yang et al. | |
| 2003/0072129 A1* | 4/2003 | Kuwako et al. | 361/525 |
| 2006/0201545 A1 | 9/2006 | Ovshinsky et al. | |
| 2006/0202176 A1 | 9/2006 | Koyama et al. | |
| 2007/0125419 A1* | 6/2007 | Gui et al. | 136/252 |
| 2007/0163637 A1* | 7/2007 | Robinson et al. | 136/262 |
| 2008/0053512 A1 | 3/2008 | Kawashima | |
| 2008/0078768 A1 | 4/2008 | Apostoluk | |
| 2008/0125527 A1* | 5/2008 | Tsuneishi et al. | 524/261 |
| 2008/0149170 A1 | 6/2008 | Hanoka | |
| 2008/0178928 A1 | 7/2008 | Warfield et al. | |
| 2008/0264484 A1* | 10/2008 | Temchenko et al. | 136/256 |
| 2009/0035566 A1 | 2/2009 | Huang et al. | |
| 2009/0242026 A1* | 10/2009 | Miyaji et al. | 136/256 |
| 2010/0000603 A1* | 1/2010 | Tsuzuki et al. | 136/259 |
| 2011/0036390 A1* | 2/2011 | Nelson et al. | 136/251 |

FOREIGN PATENT DOCUMENTS

| | | |
|---|---|---|
| EP | 2408016 A1 | 1/2012 |
| FR | 1578546 | 8/1969 |
| GB | 1385713 | 2/1975 |
| JP | 53132074 A | 11/1978 |
| JP | 55032686 | 3/1980 |
| JP | 61293840 A | 12/1986 |
| JP | 9183185 A | 7/1997 |
| JP | 2001036116 A | 2/2001 |
| WO | 9609024 A1 | 3/1996 |
| WO | 2005056285 A1 | 6/2005 |
| WO | 2006089044 A2 | 8/2006 |
| WO | 2010064491 A1 | 6/2010 |
| WO | 2010104070 A1 | 9/2010 |

OTHER PUBLICATIONS

Rees, Richard W., Ionic Bonding in Thermoplastic Resins, DuPont Innovation, 1971, pp. 1-4, vol. 2(2).

Rees, Richard W., Physical Properties and Structural Features of Surlyn Ionomer Resins, Polyelectrolyes, 1976, pp. 177-197.

U.S. Appl. No. 13/315,326, filed Dec. 9, 2011.

* cited by examiner

FIRE RESISTANT BACK-SHEET FOR PHOTOVOLTAIC MODULE

FIELD OF THE INVENTION

The present invention relates to back-sheet laminates for photovoltaic modules, and more particularly to fire resistant back-sheet laminates. The invention also relates to photovoltaic modules incorporating such fire resistant back-sheet laminates.

BACKGROUND OF THE INVENTION

As a renewable energy resource, the use of photovoltaic modules is rapidly expanding. A photovoltaic module (also known as a solar cell module) refers to a photovoltaic device for generating electricity directly from light, particularly, from sunlight. With increasing use of photovoltaic modules, comes an increased demand for photovoltaic modules suitable for use in demanding environments. Photovoltaic modules are normally installed in outdoor locations such as on a roof, wall or other supporting structure. Many climate areas where sunlight is plentiful are also places where fire is of concern. Photovoltaic modules installed on building exteriors in fire prone areas may need to be fire resistant.

Figure 1:
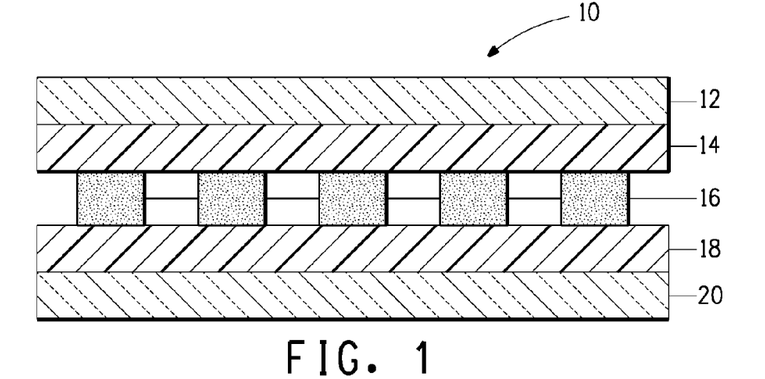
FIG. 1 is a cross-sectional view of one particular embodiment of a photovoltaic module.

As shown in FIG. 1, a photovoltaic module 10 comprises a light-transmitting substrate 12 or front sheet, an encapsulant layer 14, an active photovoltaic cell layer 16, another encapsulant layer 18 and a back-sheet 20. The light-transmitting front sheet substrate, also known as the incident layer, is typically glass or a durable light-transmitting polymer film. The encapsulant layers 14 and 18 adhere the photovoltaic cell layer 16 to the front and back sheets and they seal and protect the photovoltaic cells from moisture and air. The encapsulant layers 14 and 18 are typically comprised of a thermoplastic or thermosetting resin such as ethylene-vinyl acetate copolymer (EVA). The photovoltaic cell layer 16 may be any type of solar cell that converts sunlight to electric current such as single crystal silicon solar cells, polycrystalline silicon solar cells, microcrystalline silicon solar cells, amorphous silicon-based solar cells, copper indium (gallium) diselenide solar cells, cadmium telluride solar cells, compound semiconductor solar cells, dye sensitized solar cells, and the like. The back-sheet 20 provides structural support for the module 10, it electrically insulates the module, and it helps to protect the module wiring and other components against the elements, including heat, water vapor, oxygen and UV radiation. The back-sheet needs to remain intact and adhered to the encapsulant for the service life of the photovoltaic module, which may extend for multiple decades.

Multilayer laminates have been employed as photovoltaic module back-sheets. One or more of the laminate layers in such back-sheets conventionally comprise a highly durable and long lasting polyvinyl fluoride (PVF) film which is available from E. I. du Pont de Nemours and Company as Tedlar® film. PVF films resist degradation by sunlight, they provide a good moisture barrier, and they are less prone to burning or melting than films made of many other polymers. PVF films are typically laminated to other less costly polymer films that contribute mechanical and dielectric strength to the back-sheet, such as polyester films, as for example polyethylene terephthalate (PET) films. Other conventional back-sheet laminates are comprised wholly of polyester films, but such back-sheets have been found to experience delamination and they are less resistant to heat and fire than PVF-based films. Conventional back-sheet polymer films, including PVF films and PET films, will burn or melt when exposed to an open flame. Fire resistant back-sheet laminates have been made that incorporate metal foils (US Patent Application Publication No. 2008-0053512) or metal plates (Japan Patent Application Publication No. 2001-036-116). However metal foils and plates are difficult to permanently adhere to other polymer back-sheet layers and they can hinder the electrical insulation properties of the back-sheet.

There is a need for a back-sheet for photovoltaic module that does not readily burn or melt when exposed to fire. There is also a need for such a back-sheet laminate that resists delamination over long periods of time. There is a further need for a back-sheet that offers excellent moisture resistance, durability, and heat and fire resistance.

SUMMARY OF THE INVENTION

A back-sheet for a photovoltaic module is disclosed that comprises a fire resistant polymeric film and a second polymeric film adhered to the fire resistant polymeric film. The fire resistant polymeric film comprises a polymer that does not melt at temperatures below 275° C. and an inorganic particulate filler selected from inorganic metal oxides and inorganic metal nitrides, and combinations thereof. The fire resistant polymer film contains from 40 to 75 weight percent inorganic particulate filler based on the total weight of the film, and the fire resistant polymeric film has an average thickness of at least 85 microns. A photovoltaic module comprising such a back-sheet is also disclosed.

In an embodiment, the fire resistant polymeric film is comprised of polymer that does not melt at temperatures below 300° C. In another embodiment, the fire resistant polymer film contains at least 50 weight percent of the inorganic particulate filler based on the total weight of the film. In other embodiments, the fire resistant polymeric film of the back-sheet has an average thickness of at least 90 microns or at least 100 microns.

In disclosed embodiments, the inorganic particulate filler of the flame resistant polymeric film is selected from the group of mica, talc, vermiculite, calcined clay, silica, alumina, titania, acicular titanium dioxide, wollastonite, boron nitride, and combinations thereof. In disclosed embodiments, the polymer of the fire resistant polymeric film is selected from the group of polyaramids, polysulfonamides, aromatic polyimides, polyamideimides, polybenzoxazoles, polybenzimidazoles, polybenzthiazoles, highly aromatic epoxies, crosslinked silicones, polyetherimides, polyesterimides, polysulfones and polyether sulfones, polyketones and polyether ketones, polyphenylene oxides, polyphenylene sulfide, aromatic polyesters, and combinations thereof. In a disclosed embodiment, the inorganic particulate filler in said fire resistant polymeric film has an average particle size of from 0.5 to 100 microns.

In a preferred embodiment, the second polymeric film of the backsheet is a fluoropolymer film. Disclosed fluoropolymer films include polymeric film comprised of polyvinylfluoride, polyvinylidene fluoride and combinations thereof. In a disclosed embodiment, the back-sheet further comprises a third polymeric film, and the fire resistant polymeric film is laminated between the second and third polymeric films. One of the second and third polymeric films may be a polyester film.

BRIEF DESCRIPTION OF THE DRAWINGS

The detailed description will refer to the following drawings, wherein like numerals refer to like elements.

DETAILED DESCRIPTION OF THE INVENTION

To the extent permitted by the United States law, all publications, patent applications, patents, and other references mentioned herein are incorporated by reference in their entirety.

The materials, methods, and examples herein are illustrative only and the scope of the present invention should be judged only by the claims.

Definitions

The following definitions are used herein to further define and describe the disclosure.

As used herein and recited in the claims, the term "a" includes the concepts of "at least one" or "one or more than one".

Unless stated otherwise, all percentages, parts, ratios, etc., are by weight.

When the term "about" is used in describing a value or an end-point of a range, the disclosure should be understood to include the specific value or end-point referred to.

In the present application, the terms "sheet" and "film" are used in their broad sense interchangeably.

In describing and/or claiming this invention, the term "copolymer" is used to refer to polymers containing two or more monomers.

The present invention relates to fire resistant back-sheet laminate structures and the use such structure as a back-sheet in a photovoltaic module. The disclosed back-sheet laminate structure comprises a fire resistant film layer that resists burning or melting when the back-sheet into which it is incorporated is exposed to an open flame. As disclosed herein, the fire resistant film layer of the back-sheet is a polymer film loaded with at least 40 weight percent of an inorganic particulate filler.

The polymer of the fire resistant film layer is a polymer that is soluble in an organic solvent and/or is otherwise processable into a film, but does not melt or burn readily once processed into a film. The polymer of the fire resistant layer film has a high glass transition temperature or high melting point and it has a high viscosity above its glass transition temperature or melting point, so that it does not melt and flow (at least when filled with the inorganic particulate) when subject to the high temperatures of a flame. Crosslinked flame resistant polymers are also suitable provided they can accept suitable levels of inorganic particulate filler without becoming too brittle. In one embodiment, the polymer of the fire resistant film layer does not melt at a temperature below 275° C., and more preferably does not melt at temperatures below 300° C.

Preferred polymers for forming the film of the fire resistant layer of the disclosed back-sheet are polyaramids (aromatic polyamides), polysulfonamides (PSA) and aromatic polyimides. Other polymers that may be used in the film of the fire resistant layer of the disclosed back-sheet include polyamideimides, polybenzoxazoles, polybenzimidazoles, polybenzthiazoles, highly aromatic epoxies, and crosslinked silicones. Additionally, polyetherimides, polyesterimides, polysulfones and polyether sulfones, polyketones and polyether ketones, polyphenylene oxides, polyphenylene sulfide, polyarylates (aromatic polyesters) (versions of these polymers that don't melt or flow either as made or with incorporated filler), may also be used in the film of the fire resistant layer of the disclosed back-sheet.

Polyaramides useful for forming the fire resistant film layer of the disclosed backsheet include aromatic polyamides as disclosed in U.S. Pat. No. 3,063,966 and aromatic polysulfonamides as disclosed in U.S. Pat. No. 3,591,559. A polysulfonamide (PSA) film may be comprised of the polymers shown below.

Aromatic polyimides that are well known in the art and are useful for forming the fire resistant film layer of the disclosed backsheet include those prepared from aromatic dianhydrides and aromatic diamines, which are typically prepared as polyamic acids in polar aprotic solvents like N,N-dimethylacetamide and are converted to polyimides via thermal or chemical imidization. Examples of such aromatic polyamic acids and polyimides or copolyimides are disclosed in U.S. Pat. Nos. 3,179,614; 3,179,633; 3,179,634; and 5,166,308. Polyimides from substantially equimolar amounts of pyromellitic dianhydride (PMDA) and 4,4'-diaminodiphenyl ether (ODA) are particularly useful due to high glass transition temperature, high thermal stability and good mechanical properties. Likewise, polyimides of biphenyldianhydride (BPDA) and p-phenylene diamine (PPD) and copolyimides with PMDA and/or ODA; and polyimides of PMDA with PPD and copolyimides with ODA and/or m-phenylene diamine (MPD) are useful. As an example, copolyimides containing 10 to 90 mole %, preferably 30 to 50 mole %, of a biphenyltetracarboxylic acid or a functional derivative thereof and 90 to 10 mole %, preferably 50 to 70 mole %, of a pyromellitic acid or a functional derivative thereof and an aromatic diamine component comprising, based on the total amount of the aromatic diamine component, 10 to 90 mole %, preferably 60 to 80 mole %, of p-phenylenediamine, and 90 to 10 mole %, preferably 40 to 20 mole %, of a diaminodiphenyl ether are particularly useful in the practice of the invention.

Inorganic particulate fillers useful in the practice of the invention include inorganic metal oxides and metal nitrides. Examples of such fillers include mica, talc, vermiculite, calcined clay, silica, alumina, titania, acicular titanium dioxide, wollastinite, boron nitride and the like. Platelet and/or fibrous fillers are preferred because they may reinforce and strengthen the film. Preferred fillers have an average particle size less than 100 microns and preferably less than 10 microns. If the particle size is too large, defects, voids and surface roughness of the film may be a problem. If the particle size is too small, the particles may be difficult to disperse and the viscosity may be excessively high. Generally speaking, average particle sizes between 0.5 to 100 microns are preferred.

Platelet-shaped fillers like mica and talc are particularly useful as they are inexpensive, disperse well and yield favorable electrical and mechanical properties. Various micas (eg. muscovite, phlogopite and synthetic) and various talcs are available commercially.

In addition to the fillers, flame resistant additives such as organic flame retardants (phosphorous-based, phosphorus and halogen-based, chlorine-based, bromine-based) or inorganic flame retardants (aluminum hydroxide, magnesium hydroxide, zinc borate, or antimony-based, guanidine-based or zirconium-based fire retardants) may be used to provide additional resistance to flame and burning of the film. Other additives such as processing aids (e.g., oligomers), antioxidants, light stabilizers, anti-static agents, heat stabilizers, ultraviolet absorbing agents, other fillers or various reinforcing agents may be added as long as they do not substantially detract from the ability of the film to provide the required burn resistance and electrical insulation.

The loading level of the filler in the polymer is also chosen to optimize the properties for a particular application. Higher levels of filler improve the flame resistance of the back-sheet and may even reduce the cost of the back-sheet, but higher filler loading may also adversely affect the mechanical properties of the film making the film brittle. A loading of 40 to 75 weight percent inorganic particulate filler based on the total weight of the fire resistant polymeric film is preferred. More preferably, the film is made with an inorganic particulate filler loading of at least 50 weight percent based on the total weight of the fire resistant polymeric film.

The fire resistant film layer of the disclosed backsheet can be produced by known film forming methods such as solvent casting. According to this method, the polymer or its precursor (eg. a polyamic acid for a polyimide) is dissolved in a solvent, the inorganic particles and any other additives are blended into the solution, and the film is formed by spreading the solution onto a casting surface or a release sheet and removing the solvent by drying and curing the polymer (eg. for polyimides) to leave the polymer film. One preferred solvent is dimethylacetamide (DMAC). Examples of other suitable solvents include dimethylformamide and N-methylpyrrolidone. Alternatively, the polymer may be polymerized in the solvent, and the inorganic particles and any other additives may be then blended into the solution, and the film may be formed by spreading the solution onto a casting surface or a release sheet and drying and, if needed, curing to leave the polymer film.

For example, a filled polyimide film can be prepared from a polyamic acid (also called a polyamide acid) solution prepared from pyromellitic dianhydride (PMDA) and oxydianiline (ODA) (aka. 4,4'-diaminodiphenyl ether) in DMAC with a slight excess of oxydianiline (approx. 21% solids, Brookfield viscosity about 50-100 poise, hereafter referred to as "prepolymer"). The prepolymer is blended in a mixer with the inorganic particulate material. The mixture is pressure filtered and then small amounts of a 6 wt % PMDA solution in DMAC are added in stepwise amounts so as to increase the molecular weight of the polymer and the viscosity of the mixture to about 2200 poise. Portions of this mixture are cast onto release sheets, followed by drying on a hot plate. The films are separated from the release sheet and then oven dried to cure to polyimide. Other useful methods for producing polyimide films are disclosed in the U.S. patents referenced above.

The fire resistant film layer preferably has an average thickness of at least 85 microns (3.35 mils), and more preferably of at least 90 microns (3.54 mils), even more preferably of at least 100 microns (3.94 mils) and even more preferably at least 125 microns (4.92 mils) and even more preferably at least 150 microns (5.91 mils). The thickness of the layer is chosen in order to meet the desired flame protection and electrical insulation properties while balancing against the increased cost and lower flexibility of thicker layers.

The disclosed back-sheet further comprises one or more other polymeric film layers laminated to the above-described fire resistant film layer. Such other polymeric film layer(s) may be comprised of polyester, polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, and fluoropolymers such as polyvinyl fluoride, polyvinylidene fluoride, polytetrafluoroethylene, ethylene-tetrafluoroethylene copolymers and the like. One polyester film that may be used in one of the other film layers is bi-axially oriented poly(ethylene terephthalate) (PET) film.

Preferred other polymeric films for the one or more other film layers are fluoropolymer films. As used herein fluoropolymers are polymers made from at least one fluorinated monomer (fluoromonomer), i.e., wherein at least one of the monomers contains fluorine, preferably an olefinic monomer with at least one fluorine or a perfluoroalkyl group attached to a doubly-bonded carbon. The fluorinated monomer is generally selected from the group of tetrafluoroethylene (TFE), hexafluoropropylene (HFP), chlorotrifluoroethylene (CTFE), trifluoroethylene, hexafluoroisobutylene, perfluoroalkyl ethylene, fluorovinyl ethers, vinyl fluoride (VF), vinylidene fluoride (VF2), perfluoro-2,2-dimethyl-1,3-dioxole (PDD), perfluoro-2-methylene-4-methyl-1,3-dioxolane (PMD), perfluoro(allyl vinyl ether) and perfluoro(butenyl vinyl ether). Non-fluorinated olefinic comonomers such as ethylene and propylene can be copolymerized with fluorinated monomers. Fluoropolymers such as polyvinyl fluoride, polyvinylidene fluoride (PVF), polytetrafluoroethylene, ethylene-tetrafluoroethylene copolymers are preferred for the fluoropolyer films. Suitable PVF films are more fully disclosed in U.S. Pat. No. 6,632,518. The preferred fluoropolymer films of the disclosed back-sheet are fluoropolymer films with melting or decomposition temperatures of 200° C. or more.

The fluoropolymer film may include up to 25% by weight of other polymers that are not fluoropolymers, such as thermoplastic adhesive polymers, and may further contain minor amounts of any additive known within the art. Such additives include, but are not limited to, plasticizers, processing aides, flow enhancing additives, lubricants, pigments, dyes, flame retardants, impact modifiers, nucleating agents to increase crystallinity, antiblocking agents such as silica, thermal stabilizers, hindered amine light stabilizers (HALS), UV absorbers, UV stabilizers, dispersants, surfactants, chelating agents, coupling agents, adhesives, primers, reinforcement additives such as glass fiber, fillers and the like.

The thickness of such other polymeric film layers is not critical and may be varied depending on the particular application. Generally, the thickness of the polymeric film will range from about 0.1 to about 10 mils (about 2.5 to 254 microns). The other polymeric film thickness may be preferably within the range of about 1 mil (25 microns) to about 4 mils (101 microns). Preferred polymers for the other polymeric film layer(s) of the disclosed back-sheet are fluoropolymer films have melting temperatures that are higher than many other polymers.

The fire resistant film layer and the other polymeric film layer(s) are preferably sufficiently stress-relieved and shrink-stable under the coating and lamination processes. Preferably, the polymeric films are heat stabilized to provide low shrinkage characteristics when subjected to elevated temperatures (i.e. less than 2% shrinkage in both directions after 30 min at 150°). In addition, one or more of the film layers of the disclosed back-sheet may be coated and included as dielectric layers or barrier layers, such as oxygen or moisture barrier layers. For example, the metal oxide coatings, such as those disclosed in U.S. Pat. Nos. 6,521,825; and 6,818,819 may function as oxygen and moisture barriers.

Metal foil layers, such as an aluminum foil, may be additionally incorporated into the back-sheet. If desired, a layer of non-woven glass fiber (scrim) may also be incorporated into the disclosed fire resistant backsheet.

The method of laminating the fire resistant film layer and the one or more other polymeric film layers may be any conventional method known in the art. In one embodiment, an adhesive is used for bonding the fire resistant film layer to the other polymeric film layer(s). The bonding method or bonding adhesive will depend on the composition of the film layers being bonded. A secure bond is needed that will not delaminate after years, and even decades, of outdoor exposure. Where the back-sheet includes a fire resistant film layer, as disclosed above, bonded to a fluoropolymer film layer, the film layers may be bonded by applying a primer layer of an amine functional acrylic polymer to the fluoropolymer film, applying a thermoplastic adhesive layer containing acid modified polyolefin to the primer layer, and adhering the thermoplastic adhesive to the fire resistant film layer, as is more fully disclosed in U.S. Pat. No. 6,632,518. Where the fire resistant film layer is bonded to other polymer film materials, other conventional adhesives known in the art may be used, such as polyurethane, acrylic and epoxy adhesives.

The adhesives may be applied through melt processes or through solution, emulsion, dispersion, and the like, coating processes. One of ordinary skill in the art will be able to identify appropriate process parameters based on the composition and process used for the coating formation. The process conditions and parameters for making coatings by any method in the art are determined by a skilled artisan for any given composition and desired application. For example, the adhesive or primer composition can be cast, sprayed, air knifed, brushed, rolled, poured or printed or the like onto the surface. Generally the adhesive or primer is diluted into a liquid media prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. The adhesive layer thickness may be in the range of 2 to 75 microns, preferably 5 to 50 microns, and more preferably 10-25 microns.

In one embodiment, the DuPont acrylic adhesive 68040 solution (from E. I. du Pont de Nemours and Company) diluted with an equal amount of toluene was brushed onto one side of the fire resistant film layer and air dried at room temperature. A polymeric PVF film or other polymeric film can be adhered by placing the polymeric film over the dried adhesive layer and the two films can be laminated to each other by placing them in a vacuum platen press at about 5 tons of force and about 150° C. for about 5 minutes.

Figure 2:
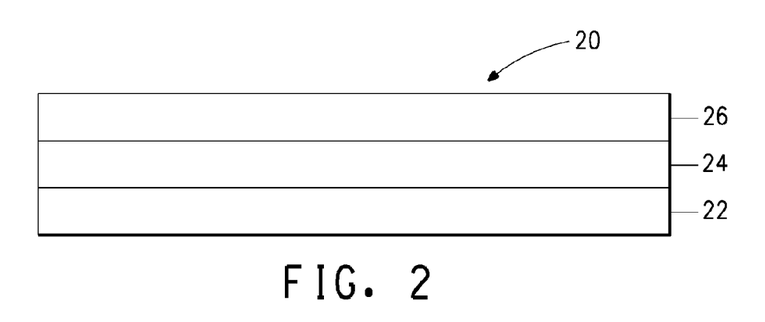
FIG. 2 is a cross-sectional view of the fire resistant back-sheet disclosed herein.

In a preferred back-sheet, the fire resistant film layer is laminated between the other polymeric film layers. For example, as shown in FIG. 2, the back-sheet 20 comprises a fire resistant film layer 24, as described above, that is laminated between other polymeric film layers 22 and 26. In one preferred embodiment, each of the other polymeric film layers 22 and 26 are fluoropolymer films such as PVF films. In another preferred embodiment, the outwardly facing polymer film layer 22 is a fluoropolymer film such as a PVF film while the other polymeric film layer that will be adhered to the encapsulant layer 18 of a photovoltaic module is comprised of another polymer that can effectively be adhered to both the encapsulant layer 18 and the fire resistant film layer 24.

The back-sheet 20 is normally bonded to the encapsulant layer 18 of the photovoltaic module via a bonding layer (not shown). Where the encapsulant layer comprises ethylene-vinyl acetate copolymer, suitable materials used for forming the bonding layer are ethylene copolymer materials, which may be selected from the following groups:

ethylene-$C_{1-4}$ alkyl methacrylate copolymers and ethylene-$C_{1-4}$ alkyl acrylate copolymers, for example, ethylene-methyl methacrylate copolymers, ethylene-methyl acrylate copolymers, ethylene-ethyl methacrylate copolymers, ethylene-ethyl acrylate copolymers, ethylene-propyl methacrylate copolymers, ethylene-propyl acrylate copolymers, ethylene-butyl methacrylate copolymers, ethylene-butyl acrylate copolymers, and mixtures of two or more copolymers thereof, wherein copolymer units resulting from ethylene account for 50%-99%, preferably 70%-95%, by total weight of each copolymer;

ethylene-methacrylic acid copolymers, ethylene-acrylic acid copolymers, and blends thereof, wherein copolymer units resulting from ethylene account for 50-99%, preferably 70-95%, by total weight of each copolymer;

ethylene-maleic anhydride copolymers, wherein copolymer units resulted from ethylene account for 50-99%, preferably 70-95%, by total weight of the copolymer;

polybasic polymers formed by ethylene with at least two co-monomers selected from $C_{1-4}$ alkyl methacrylate, $C_{1-4}$ alkyl acrylate, ethylene-methacrylic acid, ethylene-acrylic acid and ethylene-maleic anhydride, non-restrictive examples of which include, for example, terpolymers of ethylene-methyl acrylate-methacrylic acid (wherein copolymer units resulting from methyl acrylate account for 2-30% by weight and copolymer units resulting from methacrylic acid account for 1-30% by weight), terpolymers of ethylene-butyl acrylate-methacrylic acid (wherein copolymer units resulting from butyl acrylate account for 2-30% by weight and copolymer units resulting from methacrylic acid account for 1-30% by weight), terpolymers of ethylene-propyl methacrylate-acrylic acid (wherein copolymer units resulting from propyl methacrylate account for 2-30% by weight and copolymer units resulting from acrylic acid account for 1-30% by weight), terpolymers of ethylene-methyl acrylate-acrylic acid (wherein copolymer units resulting from methyl acrylate account for 2-30% by weight and copolymer units resulted from acrylic acid account for 1-30% by weight), terpolymers of ethylene-methyl acrylate-maleic anhydride (wherein copolymer units resulting from methyl acrylate account for 2-30% by weight and copolymer units resulting from maleic anhydride account for 0.2-10% by weight), terpolymers of ethylene-butyl acrylate-maleic anhydride (wherein copolymer units resulting from butyl acrylate account for 2-30% by weight and copolymer units resulted from maleic anhydride account for 0.2-10% by weight), and terpolymers of ethylene-acrylic acid-maleic anhydride (wherein copolymer units resulting from acrylic acid account for 2-30% by weight and copolymer units resulting from maleic anhydride account for 0.2-10% by weight);

copolymers formed by ethylene and glycidyl methacrylate with at least one co-monomer selected from $C_{1-4}$ alkyl methacrylate, $C_{1-4}$ alkyl acrylate, ethylene-methacrylic acid, ethylene-acrylic acid, and ethylene-maleic anhydride, non-restrictive examples of which include, for example, terpolymers of ethylene-butyl acrylate-glycidyl methacrylate, wherein copolymer units resulting from butyl acrylate account for 2-30% by weight and copolymer units resulting from glycidyl methacrylate account for 1-15% by weight;

and blends of two or more above-described materials.

The thickness of the bonding layer suitable for bonding back-sheet to the encapsulant layer may be 10 to 400 microns, preferably 40 to 200 microns. The bonding layer may contain various types of additives. Suitable non-restrictive examples are photo-stabilizers, thermal stabilizers, slip agents, light reflecting additives, and pigments. There are no specific restrictions on the content of the additives in the bonding layer, as long as the additives do not produce an adverse impact on the bonding layer or final bonding properties.

The bonding layer may be bonded to the substrate by using any methods known in the art. Non-restrictive examples of suitable bonding methods include, for example, melting suitable copolymer resin in an extruder and then coating the melt on the substrate surface by extrusion through an extruder die, or adhering the bonding layer to the substrate with an adhesive.

The encapsulant layers 14 and 18 of the photovoltaic module are typically comprised of ethylene methacrylic acid and ethylene acrylic acid, ionomers derived therefrom, or combinations thereof. Such encapsulant layers may also be films or sheets comprising poly(vinyl butyral)(PVB), ethylene vinyl acetate (EVA), poly(vinyl acetal), polyurethane (PU), linear low density polyethylene, polyolefin block elastomers, ethylene acrylate ester copolymers, such as poly(ethylene-co-methyl acrylate) and poly(ethylene-co-butyl acrylate), ionomers, silicone polymers and epoxy resins. As used herein, the term "ionomer" means and denotes a thermoplastic resin containing both covalent and ionic bonds derived from ethylene/acrylic or methacrylic acid copolymers. In some embodiments, monomers formed by partial neutralization of ethylene-methacrylic acid copolymers or ethylene-acrylic acid copolymers with inorganic bases having cations of elements from Groups I, II, or III of the Periodic table, notably, sodium, zinc, aluminum, lithium, magnesium, and barium may be used. The term ionomer and the resins identified thereby are well known in the art, as evidenced by Richard W. Rees, "Ionic Bonding In Thermoplastic Resins", DuPont Innovation, 1971, 2(2), pp. 1-4, and Richard W. Rees, "Physical 30 Properties And Structural Features Of Surlyn Ionomer Resins", Polyelectrolytes, 1976, C, 177-197. Other suitable ionomers are further described in European patent EP1781735. The encapsulant layers typically have a thickness greater than or equal to 20 mils (508 microns). The encapsulant layers may further contain any additive known within the art. Such exemplary additives include, but are not limited to, plasticizers, processing aides, flow enhancing additives, lubricants, pigments, dyes, flame retardants, impact modifiers, nucleating agents to increase crystallinity, antiblocking agents such as silica, thermal stabilizers, hindered amine light stabilizers (HALS), UV absorbers, UV stabilizers, dispersants, surfactants, chelating agents, coupling agents, adhesives, primers, reinforcement additives such as glass fiber, fillers and the like.

The photovoltaic cell layer 16 (also know as the active layer) is made of an ever increasing variety of materials. Within the present invention, a solar cell is meant to include any article which can convert light into electrical energy. Typical art examples of the various forms of solar cells include, for example, single crystal silicon solar cells, polycrystal silicon solar cells, microcrystalline silicon solar cells, amorphous silicon based solar cells, copper indium (gallium) diselenide solar cells, cadmium telluride solar cells, compound semiconductor solar cells, dye sensitized solar cells, and the like. The most common types of solar cells include multi-crystalline solar cells, thin film solar cells, compound semiconductor solar cells and amorphous silicon solar cells due to relatively low cost manufacturing ease for large scale solar cells. Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module.

The photovoltaic module may further comprise one or more sheet layers or film layers to serve as the light-transmitting substrate 12 (also know as the incident layer or the front sheet). The light-transmitting substrate 12 may be comprised of glass or plastic sheets, such as, polycarbonate, acrylics, polyacrylate, cyclic polyolefins, such as ethylene norbornene polymers, polystyrene, polyamides, polyesters, fluoropolymers and the like and combinations thereof. Glass most commonly serves as the incident layer of the photovoltaic solar module. The term "glass" is meant to include not only window glass, plate glass, silicate glass, sheet glass, low iron glass, tempered glass, tempered CeO-free glass, and float glass, but also includes colored glass, specialty glass which includes ingredients to control, for example, solar heating, coated glass with, for example, sputtered metals, such as silver or indium tin oxide, for solar control purposes, E-glass, Toroglass, Solex® glass (a product of Solutia) and the like. The type of glass to be selected for a particular laminate depends on the intended use.

A process of manufacturing the photovoltaic module with the disclosed fire resistant back-sheet will now be disclosed. The photovoltaic module may be produced through autoclave and non-autoclave processes. For example, the photovoltaic module constructs described above may be laid up in a vacuum lamination press and laminated together under vacuum with heat and standard atmospheric or elevated pressure. In an exemplary process, a glass sheet, a front-sheet encapsulant layer, a photovoltaic cell layer, a back-sheet encapsulant layer and a fire resistant back-sheet as disclosed above are laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 120° C. to about 180° C., at a pressure of about 200 psi (about 15 bars), for from about 10 to about 50 minutes. Preferably the bag is autoclaved at a temperature of from about 120° C. to about 160° C. for 20 minutes to about 45 minutes. More preferably the bag is autoclaved at a temperature of from about 135° C. to about 160° C. for about 20 minutes to about 40 minutes.

Air trapped within the laminate assembly may be removed through a nip roll process. For example, the laminate assembly may be heated in an oven at a temperature of about 80° C.

to about 120° C., or preferably, at a temperature of between about 90° C. and about 100° C., for about 30 minutes. Thereafter, the heated laminate assembly is passed through a set of nip rolls so that the air in the void spaces between the photovoltaic module outside layers, the photovoltaic cell layer and the encapsulant layers may be squeezed out, and the edge of the assembly sealed. This process may provide the final photovoltaic module laminate or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and the pressure is raised to between about 100 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the photovoltaic module laminates are removed from the autoclave. The described process should not be considered limiting. Essentially, any lamination process known within the art may be used to produce the fire resistant photovoltaic modules disclosed herein.

If desired, the edges of the photovoltaic module may be sealed to reduce moisture and air intrusion by any means known within the art. Such moisture and air intrusion may degrade the efficiency and lifetime of the photovoltaic module. Edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples are intended to be illustrative of the present invention, and are not intended in any way to limit the scope of the present invention.

The fire resistant polymeric films of the Examples are described below.

Comparative Example 1

150 g of polysulfonamide fiber (available as Tanlon™ fiber from Shanghai Tanlon Fiber Co., Ltd., China) was dissolved in 787.5 g of dimethylacetamide (DMAC) to form a 16 wt % polysulfonamide (PSA) solution. This solution was cast onto 9 mil (229 micron) Duofoil™ aluminum release sheet, then dried at about 80° C. on a hot plate to give tack free film which was separated from the Duofoil, then placed on a pin frame and then placed in an air oven which was ramped to about 300° C. and held at this temperature for about an hour. After cooling the PSA film was released from the pin frame. A polysulfonamide (PSA) film of about 3 mils (76 micron) resulted.

Comparative Example 2

The PSA solution of Comparative Example 1 was cast and oven dried according to the process described in Comparative Example 1, except that the film was cast with a greater thickness. A polysulfonamide PSA film of about 6 mils (152 micron) resulted.

Example 1

150 g of the polysulfonamide polymer solution described in Comparative Example 1 was mixed with 24 g of FlexTalc® 610C (Kish Co. Mentor, Ohio USA) to form a talc in PSA dispersion (50 wt % talc based on the total weight of the filler and dry polymer). This dispersion was pressure filtered through a 45 micron filter, then coated and dried as described in Comparative Examples 1 and 2 to give a talc-containing PSA film of about 6 mils (152 micron) thick which although somewhat brittle produced a coherent film which could be handled.

Comparative Examples 3 and 4

200 g of a polyamic acid solution prepared from pyromellitic dianhydride (PMDA) and oxydianiline (ODA) (aka. 4,4'-diaminodiphenyl ether) in DMAC with a slight excess of oxydianiline had ~21% solids and a Brookfield viscosity about 50-100 poise (hereafter referred to as "Prepolymer"). The Prepolymer was blended in a Thinky ARE-250 mixer with 13.74 g Polyplate® P01 clay (Huber Engineered Materials, Atlanta, Ga., USA). This mixture was pressure filtered through a 45 micron filter and then small amounts of a 6 wt % PMDA solution in DMAC was added in stepwise amounts to increase the molecular weight of the polymer and the viscosity of the mixture to about 2200 poise. Portions of this mixture were cast at two different thicknesses onto Duofoil sheets as described in Comparative Example 1, followed by drying to tack free films on a hot plate at about 80° C. The films were separated from the Duofoil sheets and were placed on pin frames which were placed in an air oven at 120° C. which was ramped to 320° C. and held for 30 minutes. After the hold at 320° C., the pin frames were removed from the oven and placed in a separate air oven at 400° C. for 5 minutes. The resulting clay containing polyimide films were separated from the pin frames after cooling to room temperature. Each film was comprised of about 25 wt % clay based on the total weight of the film. The films had a thickness of 3.5 mils (89 micron) (Comparative Example 3) and 5.2 mils (132 micron) (Comparative Example 4).

Comparative Examples 5 and 6

The procedure of Comparative Examples 3 and 4 was followed but with 13.74 g of HR-2 mica (Kish Co. Mentor, Ohio, USA) in place of the clay. The viscosity of the mixture that was cast was about 1500 poise. Mica containing polyimide films were obtained that were comprised of about 25 wt % mica based on the total weight of the film. The films had a thickness of 3.2 mils (81 micron) (Comparative Example 5) and 6.0 mils (152 micron) (Comparative Example 6).

Examples 2 and 3

The procedure of Comparative Examples 5 and 6 was followed but with 41.2 g of HR-2 mica in place of the clay. The viscosity of the mixture that was cast was about 3900 poise. Mica containing polyimide films were obtained that were comprised of about 50 wt % mica based on the total weight of the film. The films had a thickness of 3.6 mils (91 micron) (Example 2) and 7.2 mils (183 micron) (Example 3).

Comparative Example 7

The procedure of Comparative Examples 3 and 4 was followed but with 13.74 g of FlexTalc® 610 (Kish Co. Mentor, Ohio, USA) in place of the clay. The viscosity of the mixture that was cast was about 2400 poise. A talc containing polyimide film was obtained that was comprised of about 25 wt % talc based on the total weight of the film. The film had a thickness of 5.5 mils (140 micron).

Example 4

The procedure of Comparative Example 7 was followed but with 41.2 g of FlexTalc® 610 in place of the clay. The viscosity of the mixture that was cast was about 3700 poise. A talc containing polyimide film was obtained that was comprised of about 50 wt % talc based on the total weight of the film. The film had a thickness of 5.5 mils (140 micron).

Comparative Example 8

Tanlon™ PSA fibers were dissolved in a beaker equipped with a paddle impeller to make a 18 wt % solids PSA polymer solution in DMAC at room temperature. 27 grams of FlexTalc® 610 was mixed with 150 grams of the PSA polymer solution in a planetary centrifugal mixer until completely dispersed as determined by examination under 10× magnification using an optical microscope. The resulting talc containing dispersion was then cast onto a polished mirror finish stainless steel plate using a wire-wound casting bar. The stainless steel carrier with polymer film was then transferred to a pre-heated 80° C. hotplate and heated until tack free. The film was then cooled, separated from the stainless steel carrier, and restrained in a clip frame. The talc containing film was then cured in a convective air oven for ten minutes each at 100° C., 200° C., and 320° C. yielding a final film thickness of ~2.0 mil (~51 micron). The film had a 50% talc filler loading based on the total weight of film.

Example 5

In the manner described in Comparative Example 8, a talc containing film was prepared except that it was cast thicker for a final film thickness of ~5.0 mil (~127 micron). The film had a 50% talc filler loading based on the total weight of film.

Comparative Example 9

An 8 mil (203 micron) thick polyethylene terephthalate sheet was obtained for comparative testing.

Back-Sheet Construction

Cut samples of the films of Comparative Examples 1-9 and Examples 1-5 were coated with DuPont 68040 acrylic (E. I. du Pont de Nemours and Company, Wilmington, Del.) adhesive solution which had been diluted with an equal amount of toluene. The coating was accomplished by uniformly brushing the diluted adhesive solution on one side of the cut film samples using a foam brush, followed by air drying for 1.5 hours at room temperature, then flipping the film sample over and brushing the other side with the diluted acrylic adhesive solution followed by air drying. The adhesive coated film samples were then placed between letter size sheets of Tedlar® WP10BH9 PVF 1 mil (25 micron) thick polyvinylfluoride film (E. I. du Pont de Nemours and Company, Wilmington, Del.) with the treated side of the Tedlar® film facing the adhesive (hereafter referred to as TXT construction) followed by lamination in a Tetrahedron 20 ton vacuum platen press at 5 tons force and 150° C. for 5 minutes (press layup—SS plate/20 mil Duofoil™ release sheet/TXT/Duofoil™ release sheet/SS plate). The resulting laminated TXT samples were typically cut to 20 cm by 20 cm size for testing.

Mini Module Assemblies

Mini PV modules where constructed where each had a back-sheet comprised of one of the TXT samples made in accordance with Examples 1-5 and Comparative Example 9. The module layup was as follows: glass substrate/EVA sheet/solar cell/EVA sheet/TXT sample. The glass substrate was a conventional front side PV module glass substrate that was about ⅛ inch (3.2 cm) thick and a 7 inch×7 inch (17.8 cm×17.8 cm) area. Both EVA sheets were 18 mil thick EVA sheets cut to the size of the glass. The solar cell was a conventional 6⅛ inch×6⅛ inch (15.6 cm×15.6 cm) crystalline silicon wafer with a dark blue color. The lamination was conducted in a vacuum platen press at about 5 tons force and about 150° C. for about 5 minutes. Each mini module area was about 7 inches×7 inches (17.8 cm×17.8 cm).

Testing

Flame testing of the laminated TXT samples and of the mini modules was conducted by a specially constructed testing rig (shown in FIG. 3) in a lab hood. A two piece sample holder 42 and a K type thermocouple disk 48 were mounted on a steel ring (not shown) that was clamped on a stand 50.

Figure 3:
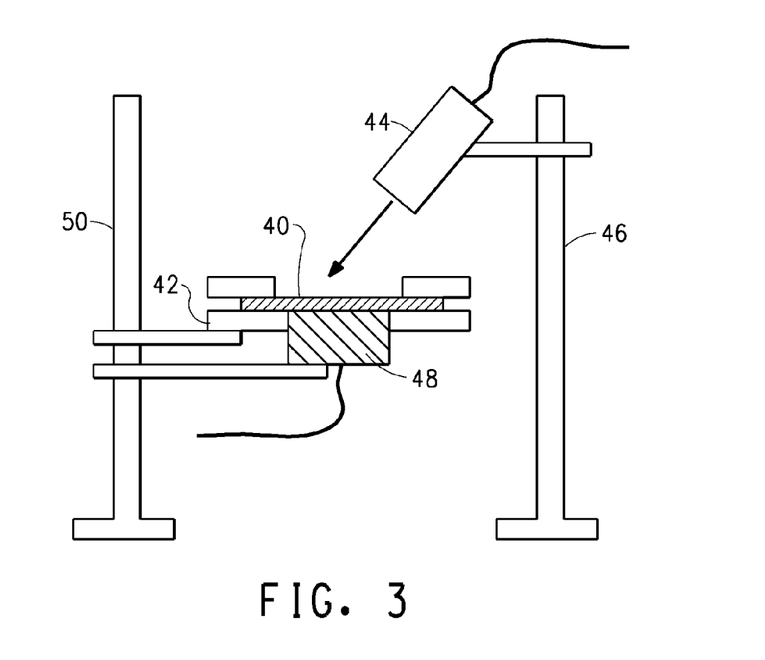
FIG. 3 shows a testing arrangement for testing the fire resistant properties of back-sheet laminate structures.

Each of the TXT samples was cut down to ~6 inch×6 inch (15.25 cm×15.25 cm) to fit into the two piece sample holder for testing. The TXT sample 40 was placed in the sample holder 42. The sample holder sat on the steel ring while the thermocouple disk was supported/adjusted inside the ring to provide a couple of mm of contact to the back of the TXT sample.

Each of the mini modules was fit into the two piece sample holder for testing. The mini module was placed in the sample holder 42 with the glass side up in a manner like that described for the TXT sample 40 above. The sample holder sat on the steel ring while the thermocouple disk was supported/adjusted inside the ring to provide a couple of mm of contact to the back of the mini module.

An approximately 2 inch (5.1 cm) diameter natural gas jet nozzle 44 was aimed at the TXT sample at an about 45 degree angle from the top to the TXT sample and spaced ~1 inch (~2.5 cm) above the TXT sample.

For the mini module testing, the 2 inch diameter natural gas jet nozzle 44 was aimed at the center of the glass side of the mini module at an about 45 degree angle from the top to the module and spaced ~1 inch (~2.5 cm) above the module.

A computer with data acquisition software recorded time and sample temperature data. The burner gas flow was calibrated (adjusted) to obtain 2.0 cal/cm² heat flux on the thermocouple disk prior to testing of each TXT sample or mini module. An initial calibration sample prepared with a 2 mil (51 microns) stainless steel foil with 1 mil (25 microns) Tedlar® film facing the flame (threat) was used for the calibration. A five minute burn was then conducted on the TXT sample or the mini module and the thermocouple readings taken over this period were recorded.

After flame testing, the TXT samples were rated as follows:
If the TXT sample showed cracks/breaks from above or below before five minutes, the test was stopped shortly thereafter and the sample was given a fail (F) rating.
If the TXT sample completed the five minute burn test without apparent cracks at the end of the burn while the TXT sample was still in the holder, but with minor cracks/breaks following removal from the holder, it was given a medium (C) rating.
If the TXT sample completed the five minute burn test without apparent cracks at the end of the burn while the TXT sample was still in the holder, and did not have apparent cracks/breaks following removal from the holder, it was given a good (A) rating.

The ratings for the TXT samples are set forth in Table 1 below. TXT samples which were rated good or medium (A or C) were considered to be acceptable, with those rated (A) were considered preferred.

After flame testing, the mini modules were rated as follows:
If smoke and flame broke out during testing, the test was stopped shortly thereafter and the mini module was given a fail (F) rating.
If there was some smoking or dripping, but no flame break out, the mini module was given a medium (C) rating.
If there was no cracked glass during the test, and the mini module did not have apparent cracks/breaks following removal from the holder, it was given a good (A) rating.

Corona Discharge

Corona breakdown was measured with a test method used for measuring the dielectric breakdown of solid electrical insulating materials under direct-voltage stress. ASTMD1868 was followed. TXT samples of Examples 1-5 were tested. The Partial Discharge Inception Voltage (CIV) and the Partial Discharge Extinction Voltage (CEV) was measured using a HiPotronics Model 705-2 CF 5 kV Corona Free Power Supply with a Biddle Instruments Series 6627000 partial discharge detector. The TXT sample film being evaluated was placed between two brass electrodes. The humidity around the sample was controlled at 50% relative humidity and the temperature was maintained at 25° C. An increasing applied test voltage was applied to the electrodes starting from a low voltage. The voltage was increased at a steady rate until the breakdown occurred. The voltage at which there was an increase in the current flow followed by arcing was recorded as the CIV. The voltage was then gradually decreased until the breakdown ceased. The voltage at which the corona discharge ended was recorded as the CEV. The voltage is measured in volts. Generally, CIVs of 600 volts are higher were considered desirable. Lower values (e.g., 200 volts) may be acceptable depending on the application. The CIVs for Examples 1-5 were each well above 600 volts.

TABLE 1

| Example | Filler | % wt Filler | X Layer Thickness (mils) | TXT Rating (ACF) | TXT CIV (V) | TXT CEV (V) | Mini Mod. Rating (ACF) |
|---|---|---|---|---|---|---|---|
| Comp Ex 1 |  | 0% | 3.0 | F |  |  |  |
| Comp Ex 2 |  | 0% | 6.0 | F |  |  |  |
| Example 1 | Talc | 50% | 6.0 | A | 800 | 675 | A |
| Comp Ex 3 | Clay | 25% | 3.5 | F |  |  |  |
| Comp Ex 4 | Clay | 25% | 5.2 | F |  |  |  |
| Comp Ex 5 | Mica | 25% | 3.2 | F |  |  |  |
| Comp Ex 6 | Mica | 25% | 6.0 | F |  |  |  |
| Example 2 | Mica | 50% | 3.6 | C | 800 | 700 | C |
| Example 3 | Mica | 50% | 7.2 | C | 950 | 850 | C |
| Comp Ex 7 | Talc | 25% | 5.5 | F |  |  |  |
| Example 4 | Talc | 50% | 5.5 | C | 900 | 850 | C |
| Comp Ex 8 | Talc | 50% | ~2.0 | F |  |  |  |
| Example 5 | Talc | 50% | ~5.0 | A | 800 | 750 | C |
| Comp Ex 9 | — |  | 8.0 | F |  |  | F |

The data in Table 1 illustrates the films of the examples provide both acceptable levels of flame resistance and electrical insulation properties. The results were dependent on both thickness and filler loading with higher loadings and thicker films providing better performance.

What is claimed is:

1. A back-sheet for a photovoltaic module comprising:
   a fire resistant polymeric film comprising a polymer that does not melt at temperatures below 300° C. and an inorganic particulate filler selected from inorganic metal oxides and inorganic metal nitrides, and combinations thereof, wherein said fire resistant polymeric film contains from 40 to 75 weight percent inorganic particulate filler based on the total weight of the film, and wherein said fire resistant polymeric film has an average thickness of at least 90 microns; and
   a second polymeric film adhered to said fire resistant polymeric film, said second polymeric film being a fluoropolymer film.

2. The back-sheet of claim 1 wherein the inorganic particulate filler of said flame resistant polymeric film is selected from the group of mica, talc, vermiculite, calcined clay, silica, alumina, titania, acicular titanium dioxide, wollastonite, boron nitride, and combinations thereof.

3. The back-sheet of claim 1 wherein the polymer of said resistant polymeric film is selected from the group of polyaramids, polysulfonamides, aromatic polyimides, polyamideimides, polybenzoxazoles, polybenzimidazoles, polybenzthiazoles, highly aromatic epoxies, crosslinked silicones, polyetherimides, polyesterimides, polysulfones and polyether sulfones, polyketones and polyether ketones, polyphenylene oxides, aromatic polyesters, and combinations thereof.

4. The back-sheet of claim 1 wherein the polymer of said fire resistant polymeric film is selected from the group of poiyaramids, polysulfonamides, polyamideimides, and aromatic polyimides.

5. The back-sheet of claim 1 wherein said fire resistant polymeric film contains at least 50 weight percent of said inorganic particulate filler based on the total weight of the film.

6. The back-sheet of claim 1 wherein said fire resistant polymeric film has an average thickness of at least 100 microns.

7. The back-sheet of claim 1 wherein said second polymeric film comprises fluoropolymer selected from polyvinylfluoride, polyvinylidene fluoride and combinations thereof.

8. The back-sheet of claim 1 further comprising a third polymeric film, and wherein said fire resistant polymeric film is laminated between said second and third polymeric films.

9. The back-sheet of claim 8 wherein said third polymeric film is a polyester film.

10. The back-sheet of claim 1 wherein said inorganic particulate filler in said fire resistant polymeric film has an average particle size of from 0.5 to 100 microns.

11. The back-sheet of claim 1 wherein said fire resistant polymeric film further comprises an organic flame retardant selected from phosphorous-based flame retardants, phosphorus and halogen-based flame retardants, chlorine-based flame retardants, bromine-based flame retardants and combinations thereof.

12. The back-sheet of claim 1 wherein said fire resistant polymeric film further comprises an inorganic flame retardant selected from aluminum hydroxide, magnesium hydroxide, zinc borate, antimony-based flame retardants, guanidine-based flame retardants, zirconium-based flame retardants, and combinations thereof.

13. A photovoltaic module comprising the back-sheet of claim 1.

* * * * *

UNITED STATES PATENT AND TRADEMARK OFFICE
CERTIFICATE OF CORRECTION

PATENT NO. : 9,050,784 B2
APPLICATION NO. : 13/315324
DATED : June 9, 2015
INVENTOR(S) : Brian C Auman et al.

Page 1 of 1

It is certified that error appears in the above-identified patent and that said Letters Patent is hereby corrected as shown below:

IN THE CLAIMS

Column 16, Claim 3, Line 20, before the word "resistant" add the word -- fire --.

Column 16, Claim 4, Line 30, please change "poiyaramids," to read -- polyaramids --.

Column 16, Claim 7, Line 41, please change "polyvinyffluoride" to read -- polyvinylfluoride --.

Signed and Sealed this
Seventeenth Day of November, 2015

Michelle K. Lee
*Director of the United States Patent and Trademark Office*